United States Patent
Torres et al.

(10) Patent No.: US 10,062,448 B1
(45) Date of Patent: Aug. 28, 2018

(54) ZERO BIAS FUSE CELL

(71) Applicant: Texas Instruments Incorporated, Dallas, TX (US)

(72) Inventors: Hector Torres, McKinney, TX (US); Mark Bryan Hamlyn, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/805,421

(22) Filed: Nov. 7, 2017

(51) Int. Cl.
*G11C 16/04* (2006.01)
*G11C 17/18* (2006.01)
*G11C 17/16* (2006.01)
*G05F 3/26* (2006.01)

(52) U.S. Cl.
CPC .............. *G11C 17/18* (2013.01); *G11C 17/16* (2013.01); *G05F 3/262* (2013.01)

(58) Field of Classification Search
CPC .............. G11C 13/0007; G11C 13/004; G11C 13/0064; G11C 13/0069
See application file for complete search history.

(56) References Cited

U.S. PATENT DOCUMENTS

| | | | | |
|---|---|---|---|---|
| 7,211,843 B2 * | 5/2007 | Low | ................... | H01L 23/5256 365/225.7 |
| 7,215,175 B1 * | 5/2007 | Mandal | .................. | G11C 17/18 327/525 |
| 8,027,187 B2 * | 9/2011 | Taylor | ...................... | G11C 7/04 365/148 |
| 9,564,243 B2 * | 2/2017 | Boldt | ...................... | G11C 17/16 |
| 2010/0067286 A1 * | 3/2010 | Taylor | ...................... | G11C 7/04 365/163 |
| 2011/0128773 A1 * | 6/2011 | Azuma | .............. | G11C 13/0007 365/148 |

\* cited by examiner

*Primary Examiner* — Tuan T Nguyen
(74) *Attorney, Agent, or Firm* — Lawrence J. Bassuk; Charles A. Brill; Frank D. Cimino

(57) ABSTRACT

A circuit includes a fuse cell with a current mirror. The first leg of the current minor includes first and second N-type transistors coupled in series between the upper and lower rails and the second leg includes third and fourth N-type transistors coupled in series between the upper and lower rails. The size of the first N-type transistor is $(Y \cdot A_1)$, the second N-type transistor is $(X \cdot A_2)$, the third N-type transistor is $(X \cdot A_1)$ and the fourth N-type transistor is $(Y \cdot A_2)$ where X and Y are integers and $A_1$ and $A_2$ are the sizes of respective reference transistors. A fuse has a first terminal coupled between the first and second N-type transistors and a second terminal coupled between the third and fourth N-type transistors; a first control node on the second leg of the current minor is coupled to control the voltage at an output node of the fuse cell.

9 Claims, 3 Drawing Sheets

ZERO BIAS FUSE CELL

FIELD OF THE DISCLOSURE

Disclosed embodiments relate generally to the field of fuse cells. More particularly, and not by way of any limitation, the present disclosure is directed to a zero bias fuse cell.

BACKGROUND

Trim circuits used in high reliability applications such as satellites must be able to perform reliably over the entire life of the satellite. For a trim circuit this means that the trim circuit reliably holds the state to which it was originally programmed. Traditional trim circuit techniques using one time programmable fuses made of polysilicon or metal are known to be sensitive to regrowth over time when a bias or electrical potential is constantly applied across the terminals of the fuse. If the fuse cell is not properly designed, regrowth in the fuse cell can result in changes to the state for which it was programmed, which can result in erroneous performance of the circuit in response to the trim code or even catastrophic failure.

The issue of fuse regrowth is typically overcome by employing a latch on power up to hold the value of the fuse cell and removing any bias from the fuse to mitigate regrowth. However, space electronics must survive exposure to high-energy protons, electrons, and, occasionally, heavier ions. These energetic particles can temporarily change the state of the latched cell and under the right circumstances can cause permanent change to the latch, again resulting in unintended circuit behavior and/or permanent failure. Keeping a circuit free of the results of high-energy encounters can require triple-redundant latches that are periodically compared with each other and corrected when one latch has a different value from two corresponding latches. These additions add greatly to the size and complexity of the circuitry.

SUMMARY

Disclosed embodiments provide a fuse cell that does not utilize a latch and is therefore not prone to the effects of the ionizing particles outlined above. A fuse is coupled between two legs of a current mirror. The transistors to whose sources the fuse is attached are unequally sized. When the fuse is intact, current flow is such that the fuse cell has a logic low output. When the fuse is blown, current flow is changed and the fuse cell has a logic high output.

The bias voltage across the blown fuse results from a difference in the gate/source voltage of the transistors to whose sources the fuse is coupled. This bias voltage can be made to be very low, e.g., less than 0.04 V, with proper sizing of the transistors. The low bias voltage across a blown fuse prevents bias-induced re-growth and removes the need for latches. The disclosed fuse cell also provides a trim preview feature while simplifying design of a serial interface for trimming.

In one aspect, an embodiment of a circuit containing a fuse cell is disclosed. The fuse cell includes a first leg of a current mirror, the first leg comprising a first N-type transistor and a second N-type transistor coupled in series between the upper and lower rails, the first N-type transistor having a size of $(Y \cdot A_1)$ and the second N-type transistor having a size of $(X \cdot A_2)$, wherein X and Y are integers and $A_1$ and $A_2$ are the sizes of reference transistors; a second leg of the current mirror, the second leg comprising a third N-type transistor and a fourth N-type transistor coupled in series coupled in series between the upper and lower rails, the third N-type transistor having a size of $(X \cdot A_1)$ and the fourth N-type transistor having a size of $(Y \cdot A_2)$; and a fuse having a first terminal coupled between the first and second N-type transistors and a second terminal coupled between the third and fourth N-type transistors, wherein a first control node on the second leg of the current mirror is coupled to control the voltage at an output node of the fuse cell.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The following embodiments are provided as examples of the disclosed fuse cells and are not intended to be limiting. For example, the fuse cells are described in terms of P-type metal oxide silicon (PMOS) transistors and N-type metal oxide silicon (NMOS) transistors, but the disclosed circuits can also be implemented utilizing bipolar transistors. A fuse cell implemented in bipolar transistors can provide an even more tightly controlled voltage across the fuse due to the exponential relationship between the base-emitter voltage to the collector current, which can potentially achieve a 10 mV difference across a blown fuse, although there is a headroom penalty with utilizing bipolar transistors. The disclosed circuit is also shown with a fuse, but the circuit can also be utilized with an anti-fuse with modifications that will be clear to one skilled in the art. Other variations will occur to one skilled in the art.

Figure 1:
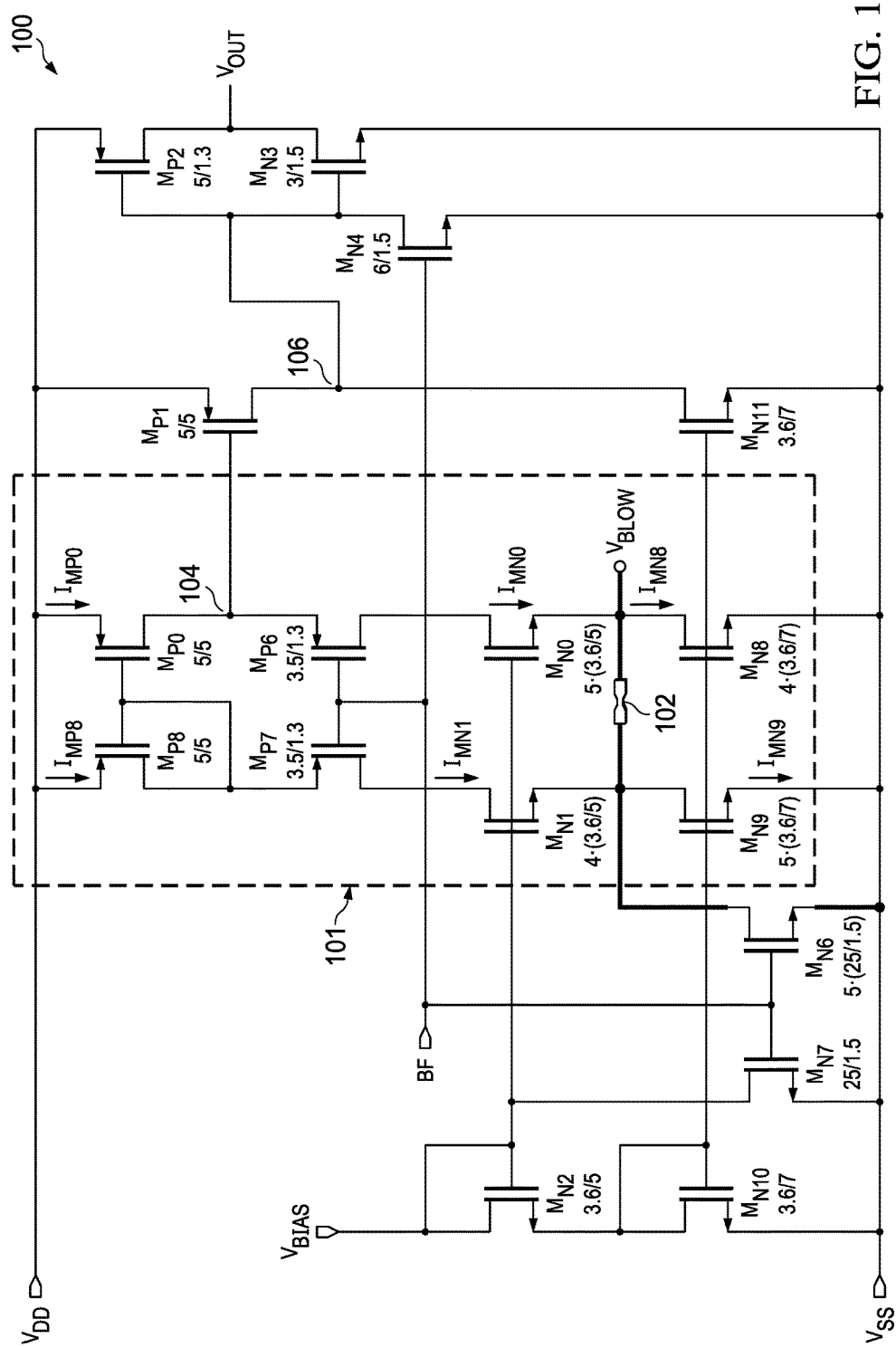
FIG. 1 depicts an example of a fuse cell according to an embodiment of the disclosure.

FIG. 1 depicts a fuse cell 100 according to an embodiment of the disclosure. A current mirror 101 forms the core of fuse cell 100, with fuse 102 coupled between the legs of the current mirror. A first leg of current mirror 101 includes PMOS transistors $M_{P8}$, $M_{P7}$ coupled in series with NMOS transistors $M_{N1}$, $M_{N9}$ between the upper rail $V_{DD}$ and the lower rail $V_{SS}$. Similarly, a second leg of the current mirror includes PMOS transistors $M_{P0}$, $M_{P6}$ coupled in series with NMOS transistors $M_{N0}$, $M_{N8}$ between $V_{DD}$ and $V_{SS}$. The gate of PMOS transistor $M_{P8}$ is coupled both to the source of $M_{P8}$ to form a diode and to the gate of PMOS transistor $M_{P0}$. The gates of PMOS transistors $M_{P7}$ and $M_{P6}$ are coupled together and to fuse control node BF, which is utilized in programming the fuse cell. The gate of each of NMOS transistors $M_{N1}$, $M_{N0}$, $M_{N9}$, $M_{N8}$ is coupled to a bias voltage $V_{BIAS}$. One terminal of fuse 102 is coupled to the source of NMOS transistor $M_{N1}$ and the drain of NMOS transistor $M_{N9}$ and the second terminal of fuse 102 is coupled to the source of NMOS transistor $M_{N0}$ and the drain of NMOS transistor $M_{N8}$.

NMOS transistors $M_{N2}$, $M_{N10}$ are coupled in series between the bias voltage $V_{BIAS}$ and the lower rail $V_{SS}$ and each of NMOS transistors $M_{N2}$, $M_{N10}$ has a respective gate tied to the respective drain. The sizes of the four NMOS transistors $M_{N1}$, $M_{N9}$, $M_{N0}$, $M_{N8}$ that surround fuse 102 are determined by their specific relationship to NMOS transistors $M_{N2}$, $M_{N10}$. If the size of NMOS transistor $M_{N2}$ is defined as $A_1$ and the size of NMOS transistor $MN_{10}$ is defined as $A_2$, then NMOS transistor $M_{N1}$ has a size of $(Y \cdot A_1)$, NMOS transistor $M_{N0}$ has a size of $(X \cdot A_1)$, NMOS transistor $M_{N9}$ has a size of $(X \cdot A_2)$, and NMOS transistor $M_{N8}$ has a size of $(Y \cdot A_2)$. In the embodiment shown in FIG. 1, the sizes of the various transistors is shown below the identifier for the transistor and is expressed as $F \cdot (W/L)$, where W is the width of the transistor, L is the length of the transistor and F, if present, indicates the number of fingers the transistor has with the given width and length. In one embodiment, the size of NMOS transistor $M_{N2}$ is 3.6/5, the size of NMOS transistor $M_{N1}$ is $4 \cdot (3.6/5)$ and the size of NMOS transistor $M_{N0}$ is $5 \cdot (3.6/5)$. Similarly, the size of NMOS transistor $M_{N10}$ is 3.6/7, the size of NMOS transistor $M_{N9}$ is $5 \cdot (3.6/7)$ and the size of NMOS transistor $M_{N8}$ is $4 \cdot (3.6/7)$.

The output of fuse cell is controlled by four transistors $M_{P1}$, $N_{M11}$, $M_{P2}$ and $M_{N3}$. PMOS transistor $M_{P1}$ and NMOS transistor $M_{N11}$ are coupled in series between the upper and lower rail. The gate of PMOS transistor $M_{P1}$ is coupled to a control node 104 that lies on the second leg of current mirror 101 between PMOS transistors $M_{P0}$ and $M_{P6}$, while the gate of NMOS transistor $M_{N11}$ is coupled to bias voltage $V_{BIAS}$. A second control node 106 lies between the drains of PMOS transistor $M_{P1}$ and NMOS transistor $M_{N11}$ and is coupled to the gates of PMOS transistor $M_{P2}$ and NMOS transistor $M_{N3}$. The output $V_{OUT}$ of fuse cell 100 is taken between the drains of PMOS transistor $M_{P2}$ and NMOS transistor $M_{N3}$.

Three final transistors in circuit 100 are utilized to either test the results of a specific configuration of the fuse or else to actually blow the fuse. NMOS transistor $M_{N7}$ is coupled between the bias voltage $V_{BIAS}$ and the lower rail $V_{SS}$ and NMOS transistor $M_{N6}$ is coupled between the first terminal of the fuse and the lower rail $V_{SS}$. Both of NMOS transistors $M_{N6}$, $M_{N7}$ are larger transistors than the remaining transistors in the circuit, with NMOS transistor $M_{N6}$ being the largest in order to conduct a large current for blowing the fuse. The gates of both of NMOS transistors $M_{N6}$, $M_{N7}$ are coupled to fuse control node BF, as is the gate of NMOS transistor $M_{N4}$, which has a drain coupled to the gates of PMOS transistor $M_{P2}$ and NMOS transistor $M_{N3}$ and a source coupled to the lower rail $V_{SS}$. In order to blow fuse 102, a high voltage can be applied at fuse blowing node $V_{BLOW}$.

When fuse cell 100 is powered on, upper rail $V_{DD}$ and lower rail $V_{SS}$ assume their respective voltages, which in one embodiment are 5 V and ground and $V_{BIAS}$ assumes a voltage that is determined by the process technology and specific design of the circuit. During normal operation, fuse control node BF has a value of 0 V and no voltage is applied at fuse blowing node $V_{BLOW}$. In operation, fuse cell 100 can have two different states: with an intact fuse 102 and with a blown fuse 102.

When fuse 102 is intact and the fuse cell powered on, the current $I_{MN9}$ through transistor $M_{N9}$ and current $I_{MN8}$ through transistor $M_{N8}$ are the tail currents for the differential pair of transistors $M_{N1}$, $M_{N0}$. NMOS transistor $M_{N0}$ is larger than NMOS transistor $M_{N1}$; therefore current $I_{MN0}$ wants to be greater than current $I_{MN1}$. Additionally, current $I_{MP8}$ is equal to current $I_{MN1}$ and current $I_{MP0}$ wants to be equal to current $I_{MP8}$. Current $I_{MP0}$ wants to be less than current $I_{MN0}$. In response to these multiple forces, control node 104 is pulled towards $V_{SS}$, turning ON PMOS transistor $M_{P1}$, which in turn causes control node 106 to be pulled towards $V_{DD}$ by PMOS transistor $M_{P1}$. When control node 106 is pulled to $V_{DD}$, PMOS transistor $M_{P2}$ is turned OFF, NMOS transistor is turned ON and $V_{OUT}$ is pulled to $V_{SS}$, which in one embodiment is ground.

When fuse 102 has been blown, current $I_{MN9}$ is greater than current $I_{MN8}$, due to the relative sizes of these two transistors, and the size of transistor $M_{N0}$ remains greater than transistor $M_{N1}$. Current $I_{MN1}$ is equal to current $I_{MN9}$ and to current $I_{MP8}$. Current $I_{MP0}$ wants to be equal to current $I_{MP8}$ but current $I_{MN0}$ is equal to current $I_{MN8}$, which is less than current $I_{MP8}$. Control node 104 is pulled to $V_{DD}$, which causes PMOS transistor $M_{P1}$ to turn OFF and control node 106 to be pulled to $V_{SS}$, which causes PMOS transistor $M_{P2}$ to be turned ON, NMOS transistor $M_{N3}$ to be turned OFF and output voltage $V_{OUT}$ to be pulled to $V_{DD}$. When fuse 102 is blown, the voltage across fuse 102 is the gate source voltage ($V_{GS}$) difference between transistors $M_{N1}$ and $M_{N0}$. It will be demonstrated that for the example shown in FIG. 1 with a supply voltage of 5 volts, the voltage across the blown fuse remains below 40 mV in the worst case.

For a transistor, the gate source voltage $V_{GS}$ can be found using the following equation:

$$V_{GS} = \sqrt{\frac{I_{D1} \times 2L}{K' \times W}} + V_T \qquad \text{Equation 1}$$

where K' is a constant that is dependent on the process technology, L is the length and W is the width of the transistor. It follows that $V_{GST}$, which is equal to gate source voltage $V_{GS}$ minus the threshold voltage $V_T$ is shown by the following equation:

$$V_{GST} = \sqrt{\frac{I_{D1} \times 2L}{K' \times W}} \quad \text{Equation 2}$$

Figure 2:
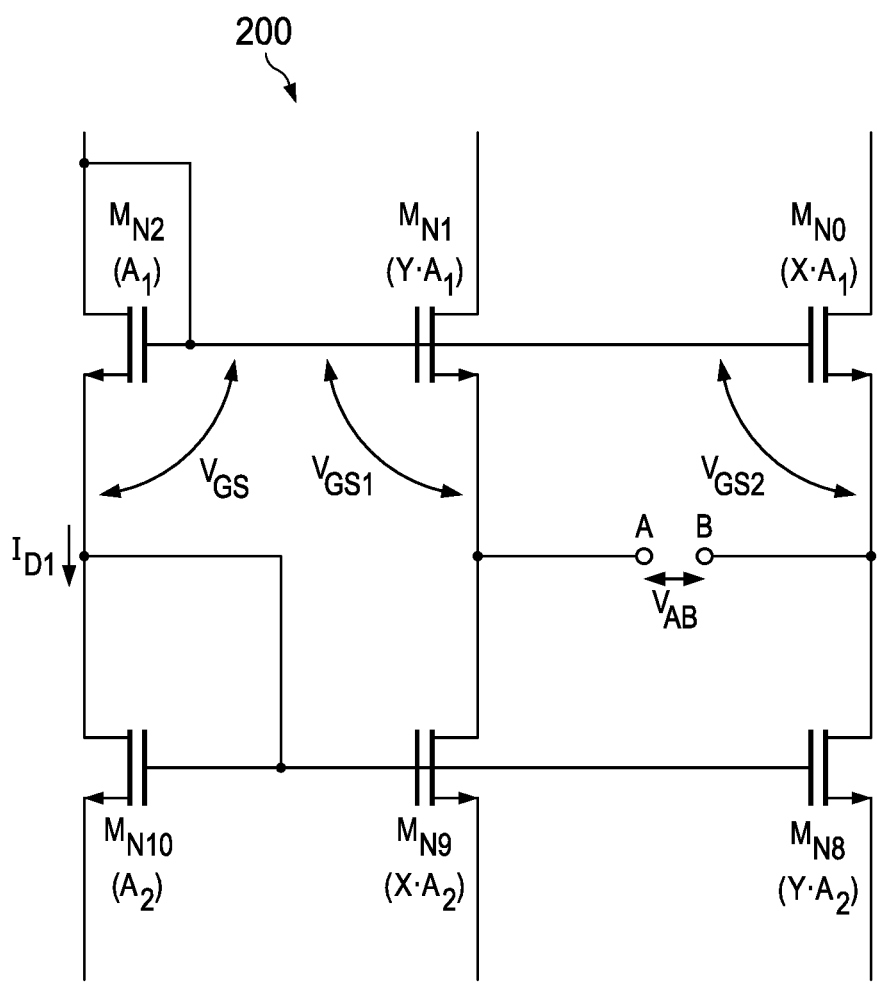
FIG. 2 depicts a simplification of key portions of the fuse cell after the fuse is blown according to an embodiment of the disclosure.

FIG. 2 depicts circuit 200, which is a simplified version of FIG. 1 that contains only the four transistors $M_{N1}$, $M_{N0}$, $M_{N9}$, $M_{N8}$ surrounding fuse 102 and the two transistors $M_{N2}$, $M_{N10}$ on which the sizes of the other four transistors are based. The fuse in circuit 200 has been blown and the voltage across the blown fuse is shown as voltage $V_{AB}$, which can be calculated by the following formula:

$$V_{AB} = V_{GS1} - V_{GS2} \quad \text{Equation 3}$$

where $V_{GS1}$ and $V_{GS2}$ are the gate source voltages of the two transistors $M_{N1}$, $M_{N0}$ to whose sources the fuse is coupled.

Because the sizes of $M_{N1}$ and $M_{N0}$ are based on the size of transistor $M_{N2}$, voltage $V_{AB}$ can be determined by substituting the values from Equation 2 into Equation 3 as follows:

$$V_{AB} \cong \sqrt{\frac{X \cdot I_{D1} \cdot 2L}{K' \cdot W \cdot Y}} - \sqrt{\frac{Y \cdot I_{D1} \cdot 2L}{K' \cdot W \cdot X}} \quad \text{Equation 4}$$

where X is the multiplier utilized to determine the sizes of transistors $M_{N0}$ and $M_{N9}$, Y is the multiplier utilized to determine the size of transistors $M_{N1}$ and $M_{N8}$, and the width and length of transistor $M_{N2}$ is utilized for the width and length. By multiplying both the numerator and denominator of the fractions by XY and combining the two square roots, the equation can be successively modified to become:

$$V_{AB} \cong \sqrt{\frac{X^2 \cdot I_{D1} \cdot 2L - Y^2 \cdot I_{D1} \cdot 2L}{K' \cdot W \cdot Y \cdot X}} \quad \text{Equation 5}$$

$$V_{AB} \cong \sqrt{\frac{I_{D1} \cdot 2L(X^2 - Y^2)}{K' \cdot W \cdot Y \cdot X}} \quad \text{Equation 6}$$

$$V_{AB} \cong \sqrt{\frac{I_{D1} \cdot 2L}{K' \cdot W}} \cdot \sqrt{\frac{(X+Y)(X-Y)}{X \cdot Y}} \quad \text{Equation 7}$$

$$V_{AB} \cong V_{GST} \cdot \sqrt{\frac{(X+Y)(X-Y)}{X \cdot Y}} \quad \text{Equation 8}$$

If $V_{GST}$ of transistor $M_{N2}$ is set at 50 mV, X has a value of 5 and Y has a value of 4, then $V_{AB}$ is approximately equal to 33.5 mV. NMOS transistors $M_{N1}$ and $M_{N0}$ can be unit transistors; alternatively, these two transistors can be fingers of NMOS transistor $M_{N2}$.

When programming the fuse cell, the terminal at $V_{BLOW}$ is forced to $V_{DD}$ and the value at BF is set high if the fuse is to be blown. When BF goes high, PMOS transistors $M_{P6}$, $M_{P7}$ are turned OFF and NMOS transistors $M_{N6}$, $M_{N7}$ are turned ON, providing a path from $V_{BLOW}$ to $V_{SS}$ through fuse 102 and transistor $M_{N6}$. A high current path flows through fuse of the cell and blows the fuse.

Figure 3:
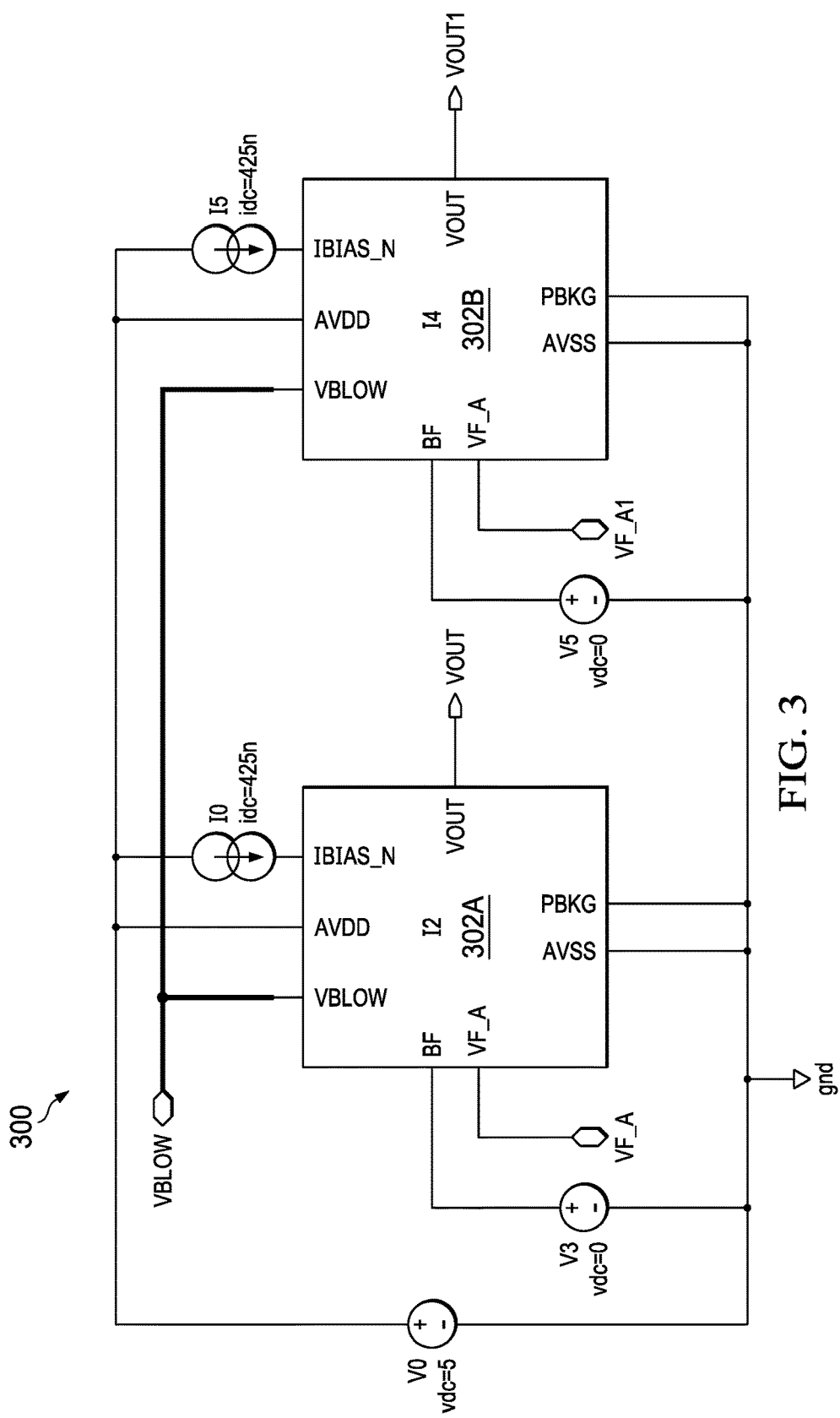
FIG. 3 depicts a portion of a trim circuit according to an embodiment of the disclosure.

FIG. 3 depicts a portion of an example trim circuit 300 that utilizes the disclosed fuse cells 100. A number of the fuse cells in trim circuit 300 will be used depending on the trim bits needed. Although trim circuit 300 can have many fuse cells 302, only two are shown in this figure, i.e., 302A, 302B, of which primarily their electrical connections are shown. The $V_{BLOW}$ terminals of all the fuse cells in trim circuit 300 are interconnected, so that all desired fuses are blown at the same time by setting their individual BF values high, while non-selected fuse cells have a low BF value. Non-selected fuse cells are self-protected.

When BF is set high, whether or not a high voltage is applied at the fuse blowing node $V_{BLOW}$, a further action occurs at the output of the fuse cell, where NMOS transistor $M_{N4}$ is turned ON, coupling the gates of output PMOS transistor $M_{P2}$ and output NMOS transistor $M_{N3}$ to ground. This action turns PMOS transistor $M_{P2}$ ON and turns NMOS transistor $M_{N3}$ OFF, setting $V_{OUT}$ high. This mechanism can be utilized to test the action of trim codes prior to permanently burning the fuses.

Simulations of the disclosed circuit were performed with an operating voltage of 5 volts, with the simulations performed at different temperatures, e.g., 25° C., 55° C. and 125° C., as well as process and voltage variations. Table 1 depicts a set of results, where μ is the mean value of the measured voltages, σ designates a standard deviation and μ−3σ and ν+3σ show the bounds of an expected statistical distribution. The voltages are shown as volts, with smaller values carrying the further designation m (millivolts), n (nanovolts) or μ (microvolts). The output voltage remains high (5 V) across all corners, including process, voltage, and temperature. Additionally, the worst case voltage across the fuse, VFUSE, is about 40 millivolts, which is not enough voltage to cause regrowth issues in the fuse.

TABLE 1

| Measurement | Min Voltage | Max Voltage | μ | σ | μ − 3σ | μ + 3σ |
|---|---|---|---|---|---|---|
| $V_{OUT}$@25 C. | 5.00 | 5.00 | 5.00 | 60.44n | 5.00 | 5.00 |
| $V_{OUT}$@125 C. | 5.00 | 5.00 | 5.00 | 5.53 μ | 5.00 | 5.00 |
| $V_{OUT}$@−55 C. | 5.00 | 5.00 | 5.00 | 8.31n | 5.00 | 5.00 |
| $V_{FUSE}$@25 C. | 34.19m | 23.65m | 28.88m | 1.98m | −34.81m | −22.94m |
| $V_{FUSE}$@125 C. | 39.00m | 28.36m | 34.13m | 1.98m | −40.36m | −29.12m |
| $V_{FUSE}$@−55 C. | −29.53m | −18.86m | −24.11m | 1.97m | −30.33m | 19.44m |

The disclosed circuit provides a simpler means of providing a robust one time programmable (OTP) trim or fuse cell. The disclosed fuse cell doesn't require a latch or flip-flop, simplifying the circuit and decreasing the size. In a space environment, where latches and flip-flops can change their state when exposed to energetic particles, the disclosed circuit is not susceptible to high-energy radiation-induced issues, while at the same time the circuit addresses the problem of fuse re-growth. Because the disclosed circuit doesn't utilize latches or flip-flops, there are fewer control lines required which simplifies the digital interface to the circuit for functions like previewing trim codes and programming.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A circuit comprising a fuse cell, the fuse cell comprising:
    a first leg of a current mirror, the first leg comprising a first N-type transistor and a second N-type transistor coupled in series between the upper and lower rails, the first N-type transistor having a size of $(Y \cdot A_1)$ and the second N-type transistor having a size of $(X \cdot A_2)$, wherein X and Y are integers and $A_1$ and $A_2$ are the sizes of reference transistors;
    a second leg of the current mirror, the second leg comprising a third N-type transistor and a fourth N-type transistor coupled in series coupled in series between the upper and lower rails, the third N-type transistor having a size of $(X \cdot A_1)$ and the fourth N-type transistor having a size of $(Y \cdot A_2)$; and
    a fuse having a first terminal coupled between the first and second N-type transistors and a second terminal coupled between the third and fourth N-type transistors, wherein a first control node on the second leg of the current mirror is coupled to control the voltage at an output node of the fuse cell.

2. The circuit as recited in claim 1 wherein:
    the first leg of the current mirror further comprises a first P-type transistor coupled in series with a second P-type transistor between an upper rail and the first N-type transistor; and
    the second leg of the current mirror further comprises a third P-type transistor coupled in series with a fourth P-type transistor between the upper rail and the third N-type transistor, the gates of the first and third P-type transistors being coupled to each other and to the drain of the first P-type transistor, the gates of the second and the fourth P-type transistors being coupled together and the first control node being between the third and the fourth P-type transistors.

3. The circuit as recited in claim 2 wherein the fuse cell further comprises a fifth N-type transistor coupled in series with a sixth N-type transistor between a bias input node and the lower rail, the fifth N-type transistor having a size of $A_1$ and the sixth N-type transistor having a size of $A_2$, the gates of the first, second, third, fourth, fifth and sixth N-type transistors being coupled to the bias input node.

4. The circuit as recited in claim 3 wherein the fuse cell further comprises:
    a fifth P-type transistor coupled in series with a seventh N-type transistor between the upper rail and the lower rail, a second control node being located between the drains of the fifth P-type transistor and the seventh N-type transistor and the first control node being coupled to the gate of the fifth P-type transistor; and
    a sixth P-type transistor coupled in series with an eighth N-type transistor between the upper rail and the lower rail, the output node of the fuse cell being coupled between the drains of the sixth P-type transistor and the eighth N-type transistor; the gate of the sixth P-type transistor and the gate of the eighth N-type transistor being coupled the second control node.

5. The circuit as recited in claim 4 wherein the fuse cell further comprises a fuse programming circuit comprising:
    a ninth N-type transistor coupled between the bias input node and the lower rail;
    a tenth N-type transistor coupled between the first terminal of the fuse and the lower rail;
    an eleventh N-type transistor having a drain coupled between the gates of the sixth P-type transistor and the eighth N-type transistor and a source coupled to the lower rail;
    the gates of the ninth, tenth and eleventh N-type transistors and the gates of the second and fourth P-type transistors being coupled to a fuse control node; and
    a fuse blowing voltage selectively coupled to the second terminal of the fuse.

6. The circuit as recited in claim 5 further comprising a plurality of fuse cells, the fuse blowing node of each of the plurality of fuse cells being coupled together.

7. The circuit as recited in claim 1 wherein X=5 and y=4.

8. The circuit as recited in claim 3 wherein the first and third N-type transistors are fingers of the fifth N-type transistors.

9. The circuit as recited in claim 1 wherein the transistors are fabricated in complementary metal oxide semiconductor (CMOS) technology.

* * * * *